United States Patent [19]
Hutter et al.

[11] Patent Number: 5,880,002
[45] Date of Patent: Mar. 9, 1999

[54] METHOD FOR MAKING ISOLATED VERTICAL PNP TRANSISTOR IN A DIGITAL BICMOS PROCESS

[75] Inventors: Louis N. Hutter, Richardson; Jeffrey P. Smith, Plano, both of Tex.

[73] Assignee: Texas Instruments Incorporated, Dallas, Tex.

[21] Appl. No.: 761,293

[22] Filed: Dec. 6, 1996

Related U.S. Application Data

[60] Provisional application No. 60/008,269 Dec. 6, 1995.

[51] Int. Cl.$^6$ .................................................... H01L 21/331
[52] U.S. Cl. ..................... 438/358; 438/208; 438/357; 438/370; 438/374; 148/DIG. 10; 257/370
[58] Field of Search ................................. 438/207, 208, 438/160, 219, 234, 265, 414, 416, 309, 357, 358, 370, 374; 257/370; 148/DIG. 10

*Primary Examiner*—Peter Toby Brown
*Assistant Examiner*—Long Pham
*Attorney, Agent, or Firm*—Robby T. Holland; Carl H. Hoel; Richard L. Donaldson

[57] ABSTRACT

A vertical PNP transistor (11) and method for making it includes forming an N− region (19) in a P substrate (12), and forming an N+ region (26) in the substrate (12) laterally surrounding and partially extending into the N− region (19). A P region (30) is formed above the N− region (19), bounded laterally by the N+ region (26) to be horizontally and vertically isolated from the substrate (12) by the N− and N+ regions (19 and 26). A layer of semiconductor material (32) is formed overall, and an N well (35) and a surrounding P well (36) are formed, each extending to the P region (30). An isolating N+ well (38) is formed surrounding the P well (36), extending to the buried N+ region (26). A P emitter region (40) and an N base contact region (41) are formed at a surface of the N well (35), and a P collector contact region (44) is formed at a surface of the P well (36). Preferably, a CMOS structure (10) may be constructed elsewhere on the substrate concurrently with at least some of the steps for making the isolated vertical PNP transistor (11). For example, in one embodiment, the step of forming a P emitter region (40), an N base contact region (41), and a P collector contact region (44) are performed as a part of the simultaneous formation of source and drain regions (47 and 48) of the CMOS structure (10) elsewhere on the substrate (12). In another embodiment, the step of forming an N base contact (54) and a P collector contact (53) are performed as a part of a simultaneous formation of source and drain regions of a CMOS structure elsewhere on the substrate. In this embodiment, a separate deeper a P emitter region (52) is formed in the N well (19) to increase the emitter X$_J$.

17 Claims, 6 Drawing Sheets

METHOD FOR MAKING ISOLATED VERTICAL PNP TRANSISTOR IN A DIGITAL BICMOS PROCESS

This application claims priority under 35 § 119(e)(1) of provisional application No. 60/008,269 filed Dec. 6, 1995.

BACKGROUND OF THE INVENTION

1. Field of the Invention

This invention relates to improvements in vertical PNP transistors and methods for making same in digital BiCMOS processes, and more particularly to improvements in methods for building high $F_t$, isolated, vertical PNP transistors in standard non-oxide-isolated digital BiCMOS twin well DUF (buried layer) processes.

2. Relevant Background

An accelerating trend in the integrated circuit industry is the merging of analog and digital functions onto the same semiconductor substrate on which an integrated circuit is constructed. Factors such as overall system speed, reliability, and board space are all involved in forcing this trend. In these so-called "mixed-signal" designs, the digital content is usually much higher than the analog content. Consequently, the choice of integrated circuit process technology usually involves adding the necessary analog components onto an existing digital manufacturing process.

Digital BiCMOS processes are usually the starting process of choice, since they combine the CMOS components for digital applications together with high-speed ($F_t \geq 10$ GHz) NPN devices needed for the analog functions. However, most digital BiCMOS processes emphasize bipolar NPN devices, without providing a suitable isolated PNP device. If any such PNP device is available, it is typically a lateral PNP device, which is very slow, with $F_t$ values in the range of about 10 MHz. Therefore, such PNP devices are generally not suitable for use in the signal path, hampering the ability to design cost-effective high-speed analog functions.

The concept of integrating isolated vertical PNP transistors into an existing junction-isolated BiCMOS process is addressed in U.S. Pat. No. 4,855,244 by Hutter and Trogolo, which describes a LinBiCMOS process. While this patent discusses the use of an N– buried layer region for vertically isolating a P-type DUF region from a P-type substrate, the description is in the context of a standard N+ buried layer process, rather than a twin well DUF process.

What is needed, therefore, for mixed-signal process technologies is a low cost method for building high $F_t$, isolated, vertical PNP transistors in a standard non-oxide-isolated digital BiCMOS twin well DUF process.

SUMMARY OF THE INVENTION

In light of the above, it is an object of the invention to provide an improved method for making isolated, vertical PNP transistors, which may be carried out as a part of a standard digital manufacturing process.

It is another object of the invention to provide an improved method of the type described in which the vertical PNP transistor are manufactured in conjunction with a non-oxide-isolated digital BiCMOS twin well DUF process.

It is yet another object of the invention to provide an improved method of the type described in which the PNP transistor that is manufactured is of sufficient quality to be suitable for use in an analog signal path.

It is yet another object of the invention to provide an improved method of the type described in which only a few additional process steps are needed to be added to a standard baseline BiCMOS process in order to construct an isolated vertical PNP transistor.

It is yet another object of the invention to provide an improved method of the type described in which N– buried layer fabrication steps, which includes a single masking operation and phosphorus implant, can be added to a baseline BiCMOS process to enable an isolated vertical PNP transistor to be built, for example using a P+ source/drain region as the emitter, the N-well region as the base, and the P-type buried as the collector.

These and other objects, features, and advantages will become apparent to those skilled in the art from the following detailed description, when read in conjunction with the accompanying drawings and appended claims.

In accordance with a broad aspect of the invention, a method is presented for making an isolated vertical PNP transistor. The method includes forming a P conductivity type buried collector region in a semiconductor substrate, with the collector region contacting surrounding isolating N conductivity type regions on bottom and lateral sides thereof. An N conductivity type base region is formed above the collector region, the base region being isolated from the substrate by the lateral surrounding N conductivity type isolating regions. A P conductivity type emitter region is formed in the base region, and a surface contact is formed to the collector region, the surface contact extending to the collector region within an area bounded by the lateral surrounding N conductivity type isolating regions.

According to another broad aspect of the invention, a method is presented for making an isolated vertical PNP transistor in which a first N conductivity type region is formed in a P conductivity type semiconductor substrate. A second N conductivity type region is formed in the substrate laterally surrounding the first N conductivity type region, the second N conductivity type region partially extending into the first N conductivity type region. A P conductivity type region is formed on the first N conductivity type region. The P conductivity type region is contained within the first N conductivity type region, and is bounded laterally by the second N conductivity type region, so that the P conductivity type region is horizontally and vertically isolated from the substrate by the first and second N conductivity type regions. A layer of semiconductor material is then formed on the substrate, and an N conductivity type well and a surrounding P conductivity type well that extend to the P conductivity type layer are formed in the P conductivity type region in the layer of semiconductor material. The layer of semiconductor material may be formed, for example, by epitaxially growing a layer of substantially intrinsic silicon to a depth of about 125 $\mu$m on the substrate. An isolating N conductivity type well is formed surrounding the P conductivity type well, also extending to the second N conductivity type region. A P conductivity type emitter region and an N conductivity type base contact region are formed at a surface of the N conductivity type well, and a P conductivity type collector contact region is formed at a surface of the P conductivity type well. Preferably, a CMOS structure may be constructed elsewhere on the substrate while performing at least some of the steps for making an isolated vertical PNP transistor; in particular, the step of forming a P conductivity type emitter region, an N conductivity type base contact region, and a P conductivity type collector contact region may performed a part of a simultaneous formation of source and drain regions of a CMOS structure elsewhere on the substrate.

In a preferred embodiment, the second N conductivity type region may be a heavily doped region and the first N conductivity type region may be a lightly doped region. For example, the step of forming the second N conductivity type region may comprise implanting antimony at a dose of between about $1\times10^{15}$ and $5\times10^{15}$ atoms/cc at an energy of about 60 keV and diffusing the antimony into the substrate at a temperature of about 1250° C. for a time of about 30 minutes. On the other hand, the step of forming the first N conductivity type region may comprise implanting phosphorus with a dose of about $4\times10^{12}$ atoms/cc at an energy of about 150 keV into the substrate, and may further comprise diffusing the phosphorus at a temperature of about 1150° C. to a depth of about 4.5 $\mu$m into the substrate. Also, the step of forming a P conductivity type region may comprise implanting boron at a dose of about $4\times10^{12}$ atoms/cc at an energy of about 60 keV.

In accordance with yet another broad aspect of the invention, a method for making an isolated vertical PNP transistor is presented. The method includes forming a first layer of oxide on a P conductivity type substrate, and patterning the layer of oxide to define an opening. The first layer of oxide may be relatively thick, and may be formed, for example, by thermally growing a layer of oxide to a thickness of about 5000 Å. An N− conductivity type region is formed in the substrate through the opening in the first layer of oxide. A second layer of oxide is then formed on the substrate, and the second layer of oxide is patterned to provide an opening surrounding the N− conductivity type region. An N+ conductivity type region is then formed in the substrate through the opening in the second layer of oxide. The second layer of oxide is then stripped from the substrate, and a third layer of oxide is formed overall. The third layer of oxide may be a thin layer, formed, for example, by thermally growing a layer of oxide on the substrate to a depth of about 300 Å. An acceptor impurity, such as boron, is introduced overall into the substrate at a level at which the acceptor impurity is bounded by the N+ conductivity type region, the third layer of oxide is stripped, and a layer of silicon is formed on the substrate. The layer of silicon may be formed, for example, by epitaxially growing a layer about 1.25 $\mu$m thick of substantially intrinsic silicon onto the substrate. An N conductivity type well surrounded by a P conductivity type well are formed in the layer of silicon, extending therethrough to a depth of the substrate, and a P conductivity type emitter region and an N conductivity type base region are formed in the N conductivity type well.

In a preferred embodiment, the step of forming an N− conductivity type region in the substrate through the opening in the first layer of oxide may comprise implanting phosphorus with a dose of about $4\times10^{12}$ atoms/cc at an energy of about 150 keV, and may further include diffusing the phosphorus at a temperature of about 1150° C. to a depth of about 4.5 $\mu$m. The step of forming an N+ conductivity type region in the substrate through the opening in the second layer of oxide may comprise implanting antimony into the substrate through the opening in the second layer of oxide, for example at a dose of between about $1\times10^{15}$ and $5\times10^{15}$ atoms/cc at an energy of about 60 keV, followed by diffusing the antimony into the substrate at a temperature of about 1250° C. for a time of about 30 minutes.

In accordance with yet another broad aspect of the invention, an isolated vertical PNP transistor is presented in which the transistor includes a semiconductor substrate and an N conductivity type buried region in the substrate. A series of contiguous alternate N and P conductivity type DUF layers are arranged, one of the P conductivity type DUF layers and at least a pair of N conductivity type DUF layers being located immediately adjacent the P conductivity type DUF layer contacting the first N conductivity type buried region. A plurality of N+ conductivity type wells that extend from a surface of the substrate to contact respective ones of the N conductivity type DUF layers provide an enclosed island of semiconductor material above the P conductivity type DUF layer. An N conductivity type well and a P conductivity type well, which surrounds the N conductivity type well, are located in the enclosed island, contacting the collector layer. The N conductivity type well forms a base of the vertical PNP transistor, and the P conductivity type buried layer and the P conductivity type well form a collector of the vertical PNP transistor. A P conductivity type emitter region is provided at a surface region of the base region.

In a preferred embodiment, the N conductivity type DUF region is a heavily doped region, the N conductivity type buried region is a lightly doped region, and a CMOS structure is included elsewhere on the substrate. The transistor may have the P conductivity type emitter region, N conductivity type base contact region, and a P conductivity type collector contact region in the P conductivity type well constructed with similar doping profiles to source and drain regions of CMOS structures elsewhere on the substrate.

BRIEF DESCRIPTION OF THE DRAWING

A preferred embodiment of the invention is illustrated in the accompanying drawings in which.

In the various Figures of the drawings, like reference numerals are used to denote like or similar parts.

DETAILED DESCRIPTION OF THE PREFERRED EMBODIMENTS

The problem of providing a low cost method for building high $F_t$, isolated, vertical PNP transistors, which may be used in mixed-signal process technologies, in a standard non-oxide-isolated digital BiCMOS process is effectively solved by the strategy described below in which the addition of a single N− buried layer region permits a vertical PNP device to be built with $F_t$ values estimated at over 1 GHz. More importantly, this technique provides a framework for building even higher speed devices through the use of more advanced base or emitter fabrication techniques.

The low-cost technique enables an isolated vertical PNP (IVPNP) transistor to be built in a conventional low-voltage digital BiCMOS process, examples of which being found in BiCMOS processes previously described by Texas Instruments Incorporated in conjunction with its processes variously known as EPIC-2B, GPL-2B, or Lin-2B processes. This is done through the addition of an N− type buried layer, which is constructed by adding a single masking operation and donor impurity implant to such baseline BiCMOS process. The N− type buried layer is placed beneath the normal P type buried layer used in these twin well DUF processes, thereby vertically isolating the PNP collector region from the P type substrate. Standard techniques can be used to achieve lateral isolation.

In one basic form of the invention, an IVPNP transistor can be constructed using a P+ CMOS source or drain region as the emitter, the N– well region as the base, and the P type buried layer as the collector. Other variations of emitter and base constructions can be used. For example, an IVPNP device using a polysilicon emitter may be fabricated. A dedicated shallow N– type base might be used for increased performance, and so on.

Figure 1A:
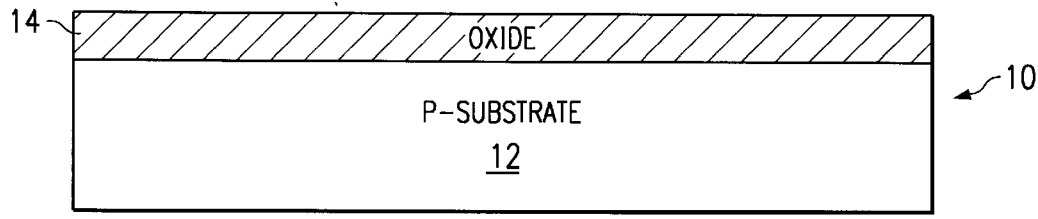
FIGS. 1a–1b, 3a–3b, 4a–4b, and 5a–5b show cross-sectional views of portions of PNP and MOS devices in a BiCMOS integrated circuit in respective stages of construction, with the CMOS and NPN portion of the circuit denoted in the Figures as "a", and the isolated vertical PNP transistor formed concurrently therewith denoted by "b".
Figure 1B:
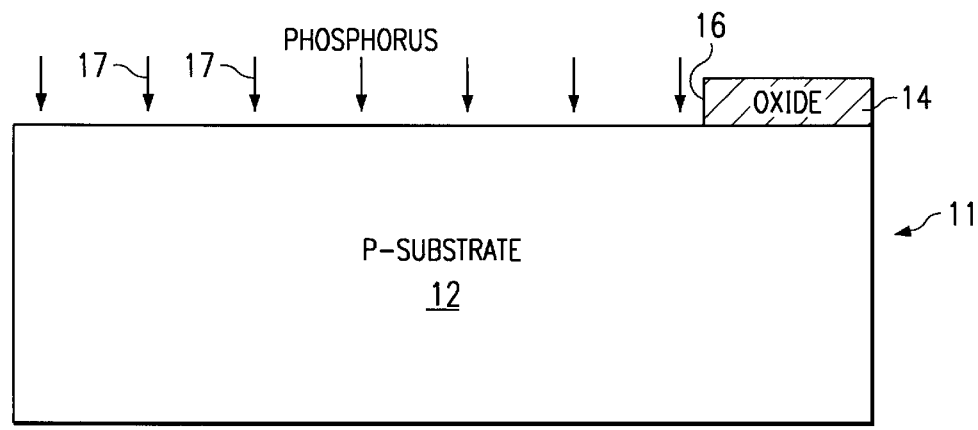

The method of one embodiment of the invention will be described in the context of Texas Instruments GPL-2B BiCMOS process, and is explained with reference now to in FIGS. 1–5. It will be understood that the process steps in the various Figures of the drawing are simultaneously performed in the respective "a" and "b" portions of each figure. It should be noted that in FIGS. 1–5, which show a BiCMOS circuit in various stages of construction, the "a" portion of the Figure illustrates the CMOS and NPN portion 10 of the circuit and the "b" portion of the Figure illustrates the isolated vertical PNP transistor portion 11 of the integrated circuit. With reference first to FIG. 1, the process starts with a silicon semiconductor substrate 12 that has been lightly doped with an acceptor type impurity, shown as a P– substrate. A layer of thermal oxide 14 of thickness of about 5000 Å is grown on the substrate 12, and a layer of photoresist (not shown) is deposited and patterned to define an opening 16 in the oxide 14 for an N– buried layer next to be formed in the construction of the isolated vertical PNP transistor, shown in FIG. 1b.

A donor impurity, such as phosphorus 17, shown in FIG. 1b, is then implanted into the region of the substrate 12 that is exposed within the window 16, with a dose, for example, of about $4\times10^{12}$ atoms/cc at an energy of about 150 keV. The photoresist and oxide 14 are then removed. The implanted phosphorus is diffused at a temperature of about 1150° C. to a depth of about 4.5 $\mu$m to form a doping profile 19 shown in FIG. 2b. At the same time, a second oxide layer 20 is grown.

Figure 2A:
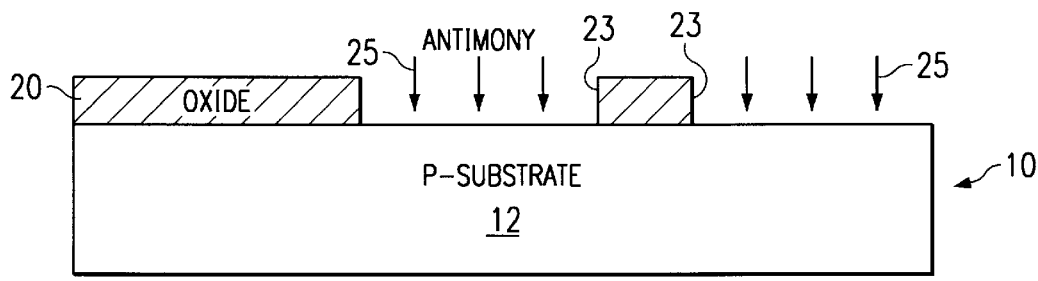
Figure 2B:
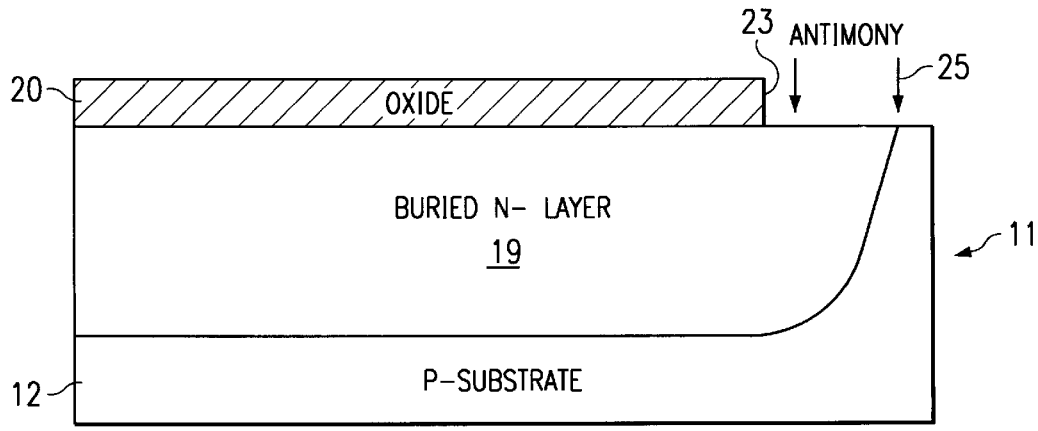
Figure 3A:
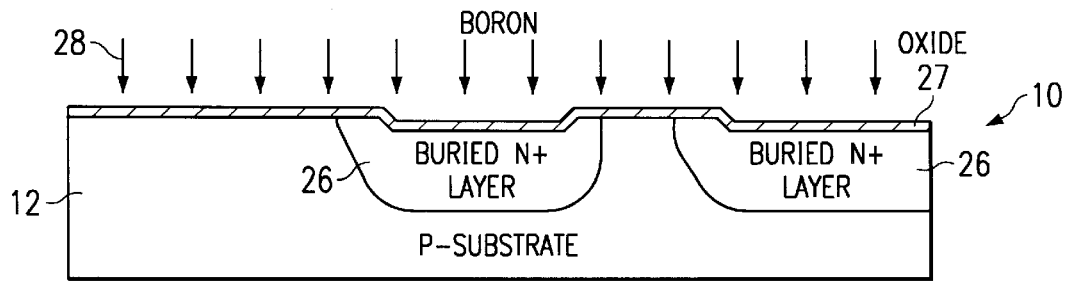
Figure 3B:
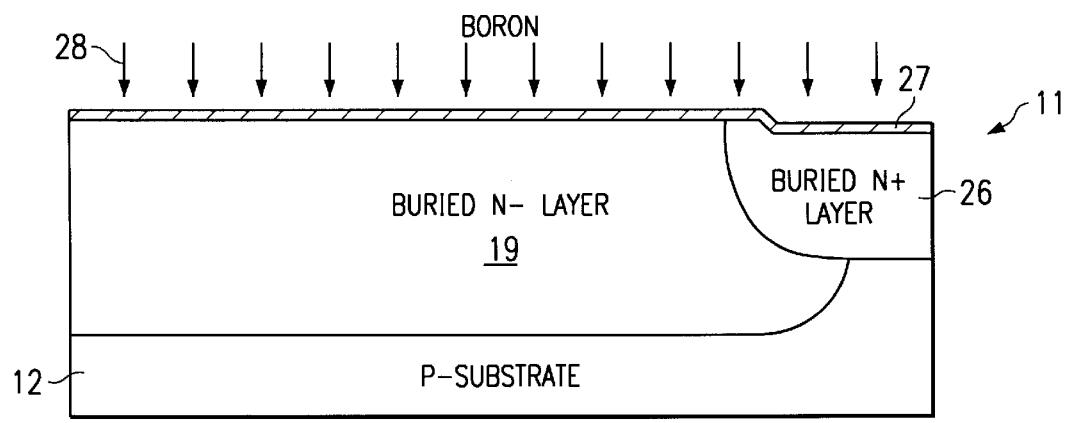

A second layer of photoresist (not shown) is then deposited and patterned to provide openings 23 in the oxide 20, which defines regions for the N+ buried layer or DUF regions 26 to be constructed for both the CMOS and NPN devices 10 (FIG. 2a) and the PNP device 11 (FIG. 2b). A donor impurity, such as antimony 25, is implanted at a dose, for instance, of between about $1\times10^{15}$ and $5\times10^{15}$ atoms/cc at an energy of about 60 keV, and diffused into the substrate 12 to provide an N+ buried layer, or DUF regions 26, as shown in FIG. 3. It is noted that the DUF regions 26 which will be associated with the PNP structure 11 are formed at the surface boundary between the buried N– layer 19 and the P– substrate 12, residing partially in both.

Figure 4A:
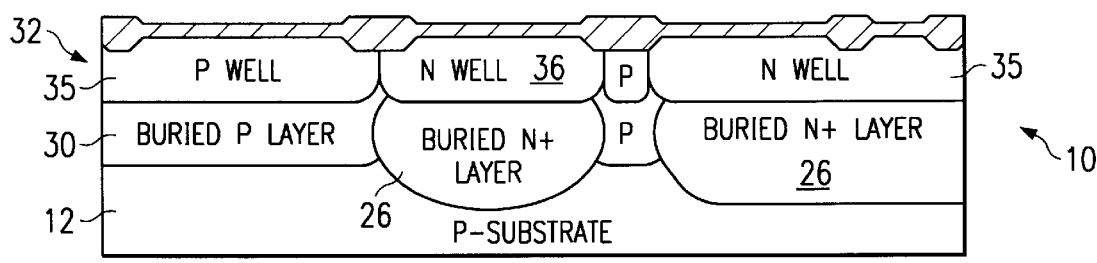
Figure 4B:
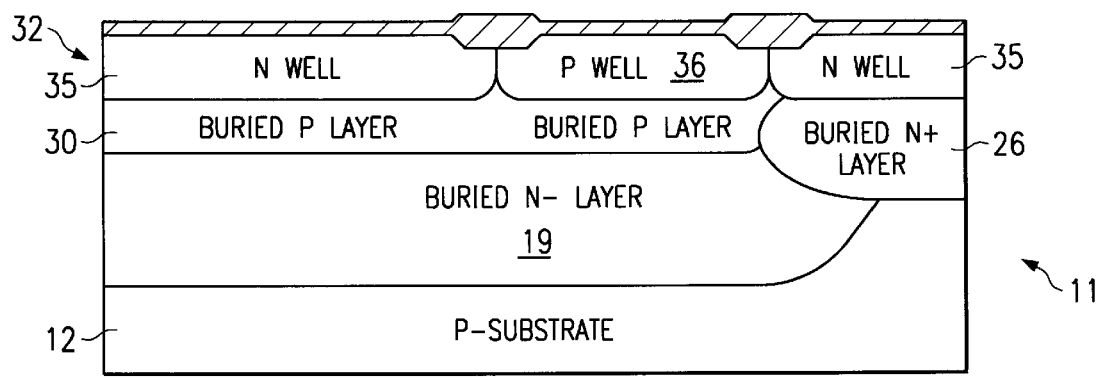

All of the oxide 20 is then stripped from the substrate, and a new, thin layer 27 of oxide of thickness of about 300 Å is formed overall. An acceptor impurity, such as boron 28 is implanted overall through the oxide layer 27 and diffused into the substrate 12 and previously formed N type layers 19 and 26. It is noted that the concentration level of the implanted boron 28 is selected so that the boron does not counterdope the buried N+ layer 26, but does produce a buried P layer, or DUF region 30 within the buried N– layer 19, as best seen in FIGS. 4a and 4b.

Next, the thin oxide layer 27 is removed, and a thin layer about 1.25 $\mu$m thick of nearly intrinsic epitaxial silicon 32 is deposited onto the wafer. Conventional CMOS twin wells are then formed in the intrinsic silicon layer 32, providing a series of contiguous P and N wells 35 and 36, shown in FIGS. 4a and 4b. As can be seen, the buried P type layer is completely isolated from the P type substrate vertically downwardly by the N– buried layer 19, and laterally by the stack formed by the N+ DUF regions 26 and deep N+ wells 38, which extend to the surface to enable contact to the buried N layer 19.

Figure 5A:
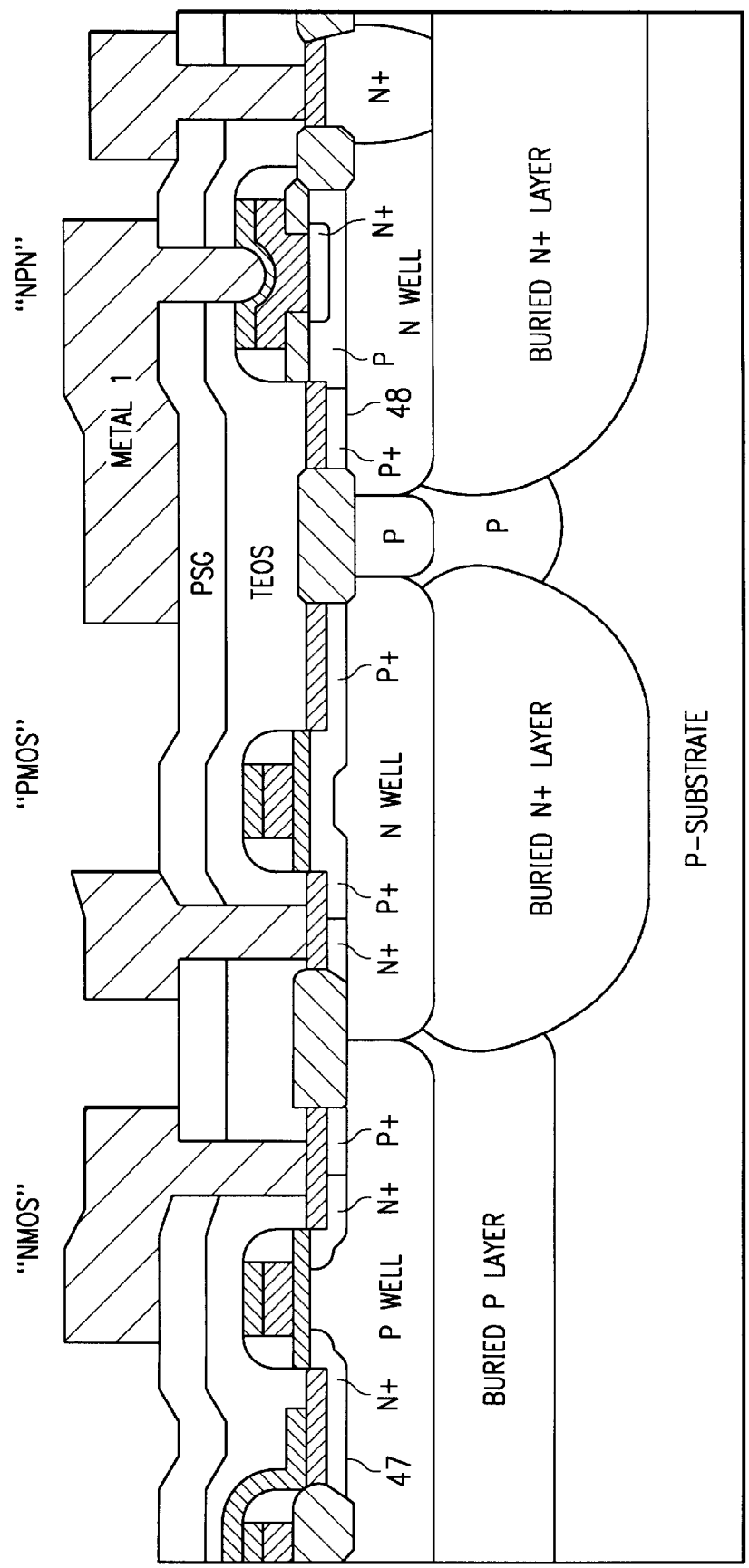
Figure 5B:
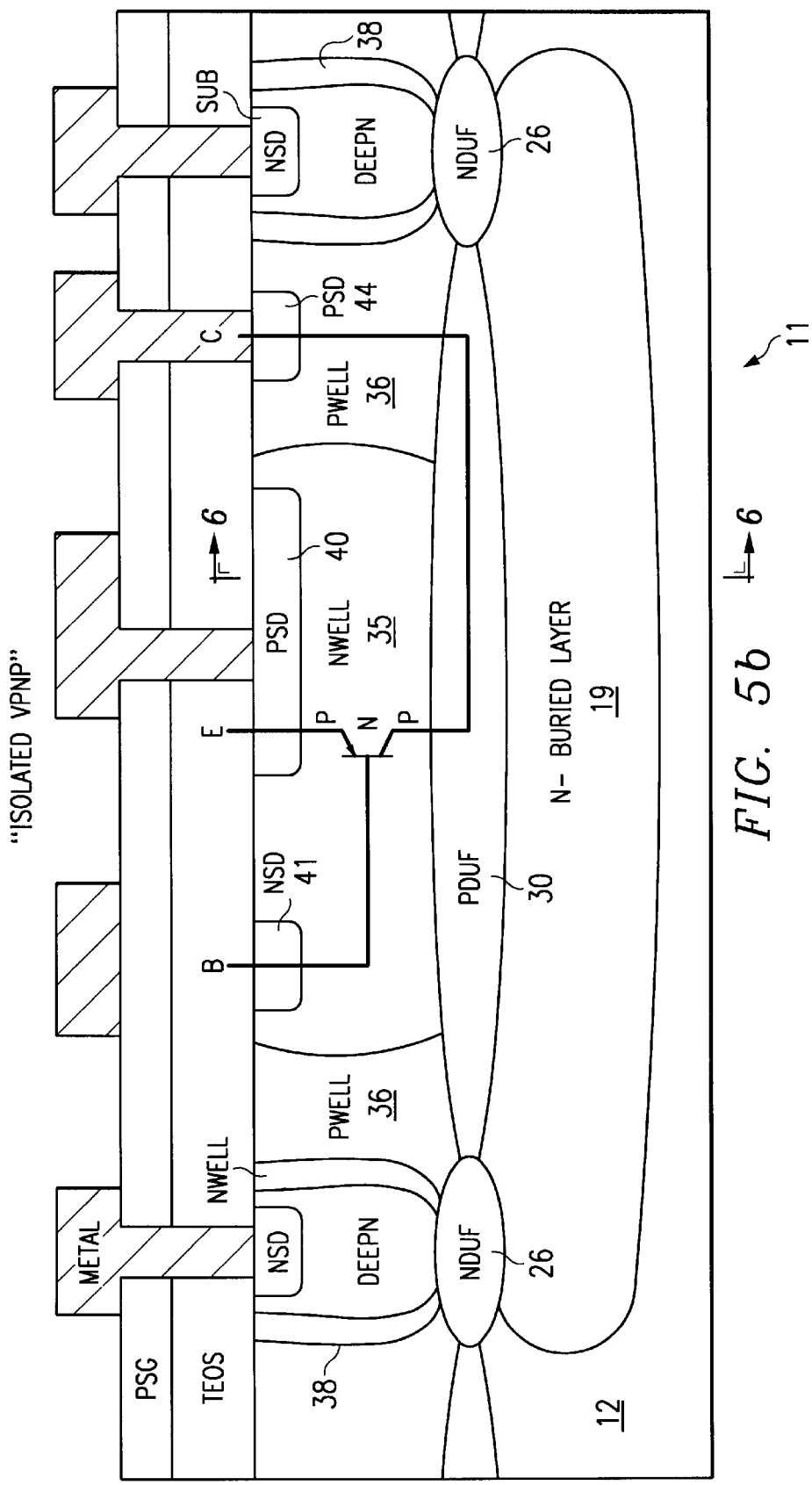

Standard processing is then performed to complete the various MOS, NPN, and PNP devices to form the structures shown in FIGS. 5a and 5b. The standard BiCMOS components, unchanged by the IVPNP processing, are shown in FIG. 5a, while a cross-sectional view of the vertical PNP structure is shown in FIG. 5b. As can be seen, the P+ source/drain regions 48 and N+ source/drain regions 47 of the CMOS devices serve as the IVPNP emitter region 40 and base region contact 41. The N well region 35 serves as the IVPNP intrinsic base region. The P-type buried DUF layer 30 acts as the IVPNP buried collector region while the surface contact to the collector is made by a P+ source/drain region 44 in the isolated P-well 36. It is noted that unlike prior vertical PNP devices, the structure shown in FIG. 5b provides for isolation of the overlying P and N well structures 36 and 35 completely from the substrate 12 by virtue of the contacting contiguous N and P type DUF regions 30 and 26.

Figure 6:
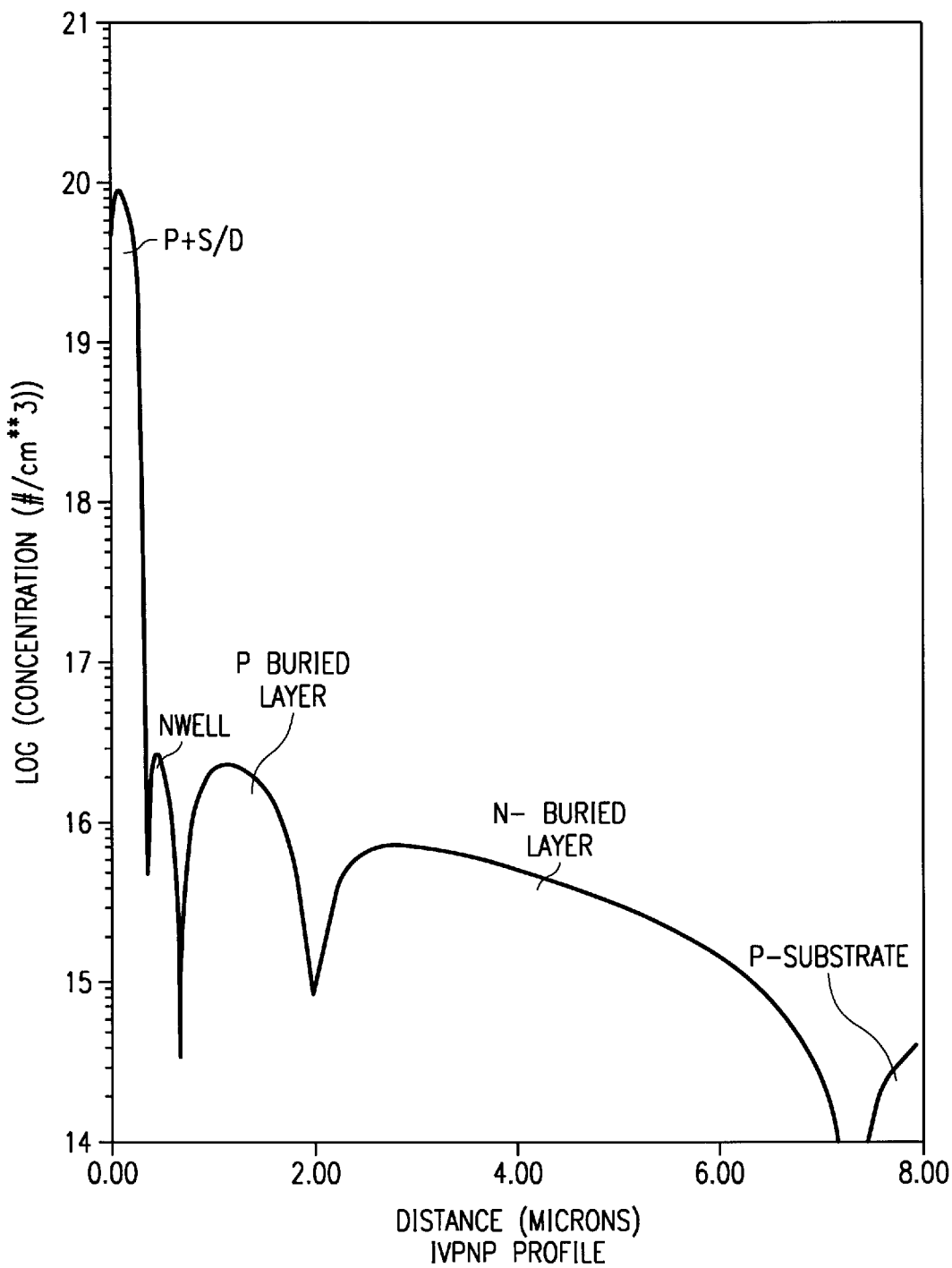
FIG. 6 is a graph of ion concentration versus depth from the surface of the device, taken at 6—6 in FIG. 5b.

A "SUPREM3" simulation of the doping profile at 6—6 vertically through the PNP transistor structure of FIG. 5b is shown in FIG. 6. As can be seen, a base width of about 0.35 $\mu$m is projected.

Figure 7:
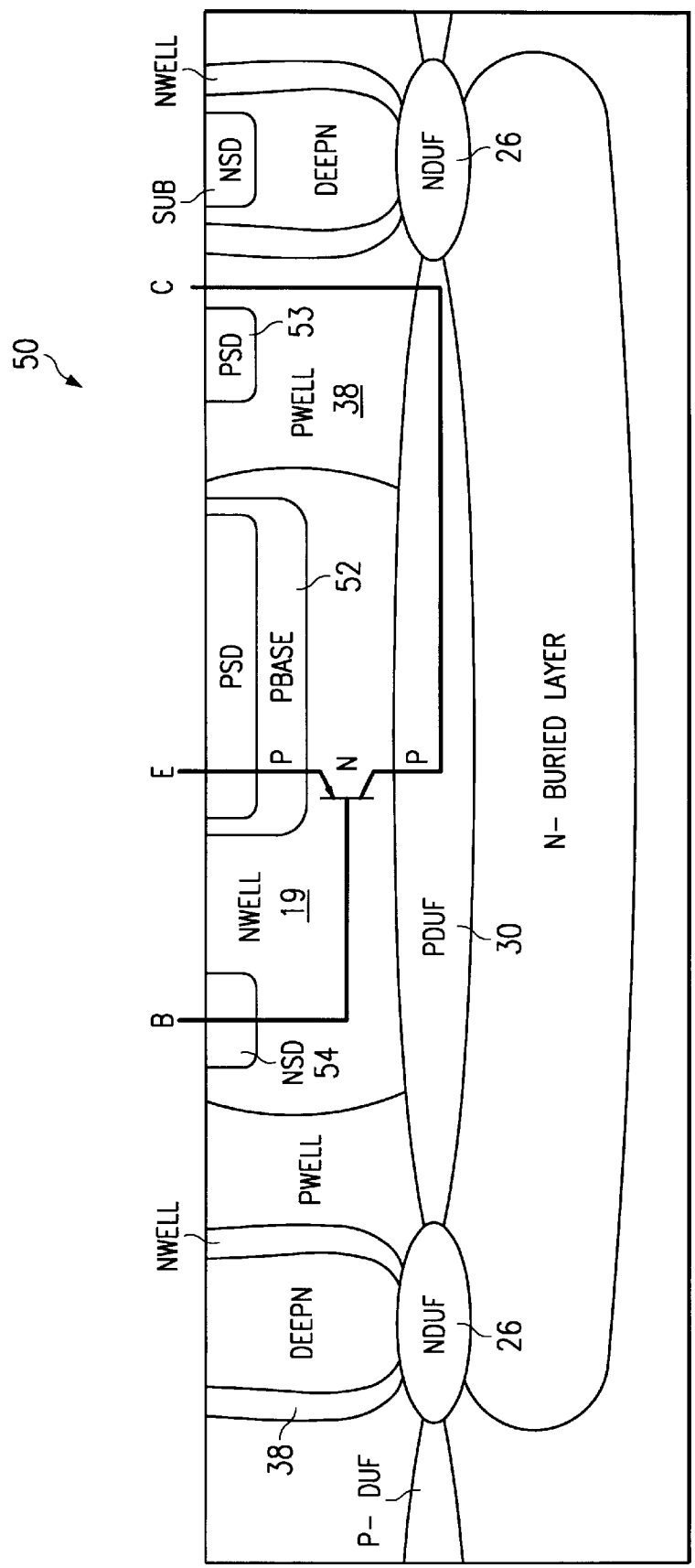
FIG. 7 is a cross-sectional view of an isolated vertical PNP transistor formed in accordance with another preferred embodiment of the invention in which the base diffusion is separately constructed for increasing the emitter $X_j$.

Additional enhancements can be made to this structure for even higher $F_t$ performance. For example the N well can be replaced with a dedicated shallow N type base (not shown), using a polysilicon emitter strategy instead of the simple P+ source or drain region, adding deep P+ regions to reduce vertical resistance to the P type DUF. While these would require additional processing steps, a modified IVPNP emitter strategy which can be utilized within the constraints of the existing BiCMOS process, a portion of which is shown in FIG. 7 prior to metallization. In FIG. 7, an isolated vertical PNP device 50 is shown, having a deeper P type diffusion 52 to deepen the PNP emitter within the N well 19. It should be noted that this deeper PBASE region 52 in FIG. 7 is just the PBASE used for the NPN built on the same substrate. Hence, no extra processing cost is incurred. The P type source/drain diffused region 53 is used to provide a high conductivity collector contact, and the N type source/drain diffused region 54 is used to provide a high conductivity base contact. Like the embodiment described above with reference to FIGS. 1–5, the IVPNP embodiment of FIG. 7 also uses the N– type buried layer concept for isolation.

Although the invention has been described and illustrated with a certain degree of particularity, it will be understood that the present disclosure has been made only by way of example, and that numerous changes in the combination and arrangement of parts will be apparent to those skilled in the art without departing from the spirit and scope of the invention as hereinafter claimed.

What is claimed is:

1. A method for making an isolated vertical PNP transistor, comprising:
   A. forming a first N conductivity type region in a P conductivity type semiconductor substrate;
   B. forming a second N conductivity type region in said substrate laterally adjacent to said first N conductivity type region, said second N conductivity type region partially extending into said first N conductivity type region;

C. forming a P conductivity typed region in said first N conductivity type region, said P conductivity type region being contained within said first N conductivity type region, and said P conductivity type region being bounded laterally by said second N conductivity typed region, whereby said P conductivity type region is horizontally and vertically isolated from said substrate by said first and second N conductivity type regions;

D. forming a layer of semiconductor material on said substrate;

E. forming an N conductivity type well and a adjacent P conductivity type well in said P conductivity type region in said layer of semiconductor material extending to said P conductivity type region;

F. forming an isolating N conductivity type well adjacent said P conductivity type well, extending to said second N conductivity type region;

G. and forming a P conductivity type emitter region and an N conductivity type base contact region at a surface of said N conductivity type well, and a P conductivity type collector contact region at a surface of said P conductivity type well.

2. The method of claim 1 wherein said second N conductivity type region is a heavily doped region and said first N conductivity type region is a lightly doped region.

3. The method of claim 1 wherein said step of forming said first N conductivity type region comprises implanting phosphorus with a dose of about $4 \times 10^{12}$ atoms/cc at an energy of about 150 keV into said substrate, and further comprising diffusing said phosphorus at a temperature of about 1150° C. to a depth of about 4.5 $\mu$m into said substrate.

4. The method of claim 1 wherein said step of forming said second N conductivity type region comprises implanting antimony at a dose of between about $1 \times 10^{15}$ and $5 \times 10^{15}$ atoms/cc at an energy of about 60 keV and diffusing said antimony into said substrate at a temperature of about 1250° C. for a time of about 30 minutes.

5. The method of claim 1 wherein said step of forming a P conductivity type region comprises implanting boron at a dose of about $4 \times 10^{12}$ atoms/cc at an energy of about 60 keV.

6. The method of claim 1 wherein said step of forming a layer of semiconductor material on said substrate comprises epitaxially growing a layer of substantially intrinsic silicon to a depth of about 1.25 $\mu$m on said substrate.

7. The method of claim 1 further comprising concurrently constructing a CMOS structure elsewhere on said substrate while performing at least some of said steps for making the isolated vertical PNP transistor.

8. The method of claim 7 wherein said steps of forming a P conductivity type emitter region, an N conductivity type base contact region, and a P conductivity type collector contact region are performed a part of a simultaneous formation of source and drain regions of a CMOS structure elsewhere on said substrate.

9. A method for making an isolated vertical PNP transistor, comprising:

A. forming a first layer of oxide on a P conductivity type substrate;

B. patterning said layer of oxide to define an opening;

C. forming an N– conductivity type region in said substrate through said opening in said first layer of oxide;

D. stripping said layer of oxide from said substrate and forming a second layer of oxide on said substrate;

E. patterning said second layer of oxide to provide an opening adjacent said N– conductivity type region;

F. forming an N+ conductivity type region in said substrate through said opening in said second layer of oxide;

G. stripping said second layer of oxide from said substrate, and forming a third layer of oxide on said substrate;

H. depositing a p-type dopant impurity into said substrate at a level at which said a p-type dopant impurity is bounded laterally by said N+ conductivity type region;

I. stripping said third layer of oxide, and forming a layer of silicon on said substrate;

J. forming an N conductivity type well adjacent by a P conductivity type well in said layer of silicon, extending therethrough to a depth of said substrate;

K. and forming a P conductivity type emitter region and an N conductivity type bases region in said N conductivity type well.

10. The method of claim 9 wherein said step of forming a third layer of oxide comprises thermally growing a layer of oxide on said substrate to a depth of about 300 Å.

11. The method of claim 9 wherein said step of forming a first layer of oxide comprises thermally growing a layer of oxide to about 5000 Å thickness.

12. The method of claim 9 wherein said step of forming an N– conductivity type region in said substrate through said opening in said first layer of oxide comprises implanting phosphorus with a dose of about $4 \times 10^{12}$ atoms/cc at an energy of about 150 keV.

13. The method of claim 12 further comprising diffusing said phosphorus at a temperature of about 1150° C. to a depth of about 4.5 $\mu$m.

14. The method of claim 9 wherein said step of forming an N+ conductivity type region in said substrate through said opening in said second layer of oxide comprises implanting antimony into said substrate through said opening in said second layer of oxide.

15. The method of claim 9 wherein said step of forming an N+ conductivity type region in said substrate through said opening in said second layer of oxide comprises implanting antimony at a dose of between about $1 \times 10^{15}$ and $5 \times 10^{15}$ atoms/cc at an energy of about 60 keV.

16. The method of claim 15 further comprising diffusing said antimony into said substrate at a temperature of about 1250° C. for a time of about 30 minutes.

17. The method of claim 9 wherein said step of forming a layer of silicon onto said substrate comprises epitaxially growing a layer about 1.25 $\mu$m thick of substantially intrinsic silicon onto said substrate.

* * * * *